(12) United States Patent
Chen

(10) Patent No.: US 7,221,183 B2
(45) Date of Patent: May 22, 2007

(54) TIE-HIGH AND TIE-LOW CIRCUIT

(75) Inventor: Ker-Min Chen, Hsin chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 164 days.

(21) Appl. No.: 11/064,362

(22) Filed: Feb. 23, 2005

(65) Prior Publication Data

US 2006/0186925 A1    Aug. 24, 2006

(51) Int. Cl.
    *H03K 17/16* (2006.01)
(52) U.S. Cl. .......................... 326/27; 326/82
(58) Field of Classification Search ................ 326/37, 326/38, 104, 112, 26, 27
    See application file for complete search history.

(56) References Cited

U.S. PATENT DOCUMENTS

| 5,900,742 | A  | * | 5/1999 | Kolze et al. .................. 326/41 |
| 6,396,306 | B2 |   | 5/2002 | Dring et al. |
| 2006/0092592 | A1 | * | 5/2006 | Huang ........................ 361/220 |

* cited by examiner

*Primary Examiner*—Don Le
(74) *Attorney, Agent, or Firm*—Duane Morris LLP

(57) ABSTRACT

A tie-high, tie-low circuit having a tie-high output and a tie-low output comprises a regenerative device to be coupled with both the tie-high and the tie-low outputs, and at least a PMOS device and a NMOS device to be coupled respectively with a high voltage and a low voltage. A diode, a NMOS device, and a PMOS device are used as regenerative devices in three examples. These three examples exhibit improved electrostatic discharge (ESD) tolerance.

19 Claims, 4 Drawing Sheets

US 7,221,183 B2

TIE-HIGH AND TIE-LOW CIRCUIT

BACKGROUND

The present invention relates generally to integrated circuit designs, and more particularly to designs with higher electrostatic discharge tolerances that can be used to tie-high or tie-low an unused IC input.

An integrated circuit (IC) application does not always require all of its inputs to be used. The inputs that are not used should advantageously be locked in a single, stable logic state, and should not be left floating, because inputs having unpredictable or intermediate logic states may have unpredictable and unrepeatable influences on logic outcomes. This is a major issue that IC designers strive to eliminate.

For stability, therefore, small circuits are inserted into ICs. The small circuits have at least two outputs: one that is always high and another that is always low. These circuits are then used to tie IC inputs to either a high state or a low state. By implementing these circuits, inputs that are not used are locked in a single, stable logic state.

However, various issues exist in the conventional designs of these circuits. For example, many of these circuits comprise at least four transistors, which take up valuable real estate in ICs and may require additional, costly production steps. As another example, some of the designs of these circuits comprise three transistors, but such designs typically exhibit limited tolerance to electrostatic discharge (ESD).

Therefore, desirable in the art of integrated circuit designs are improved designs with smaller circuits having increased ESD tolerance that can be used to tie-high or tie-low an unused IC input.

SUMMARY

In view of the foregoing, the following provides circuits and methods to improve ESD tolerance in circuits that are used to tie-high or tie-low an unused IC input.

In one embodiment, circuits are constructed to provide tie-high and tie-low outputs having always-high and always-low signals for locking the logic state of unused inputs. A tie-high, tie-low circuit having a tie-high output and a tie-low output comprises a regenerative device coupled to both the tie-high and the tie-low outputs, and at least a PMOS device and a NMOS device coupled respectively to a high voltage and a low voltage. A diode, a NMOS device, and a PMOS device are used as regenerative devices in three examples. These three examples exhibit improved electrostatic discharge (ESD) tolerance.

The construction and method of operation of the invention, however, together with additional objects and advantages thereof will be best understood from the following description of specific embodiments when read in connection with the accompanying drawings.

DESCRIPTION

The following provides a detailed description of circuits and methods to improve ESD tolerance in, and reduce physical size of, circuits that are used to tie-high or tie-low an unused IC input.

Figure 1:
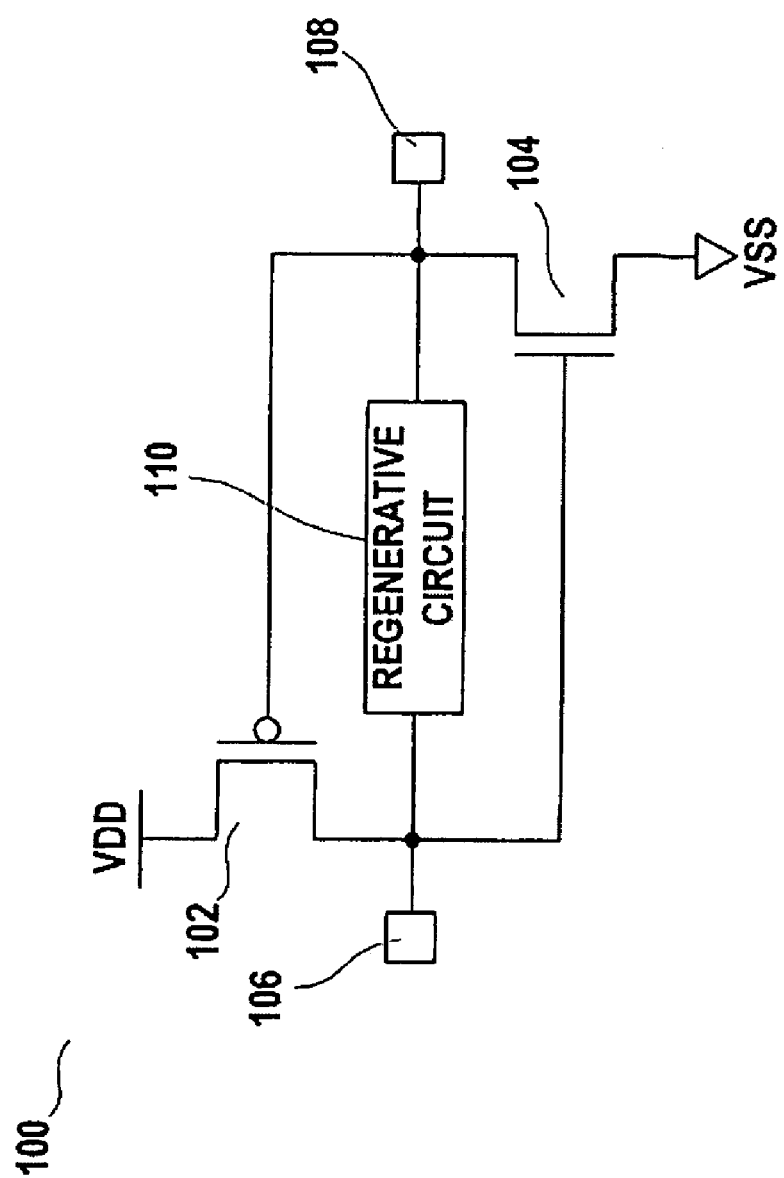
FIG. 1 illustrates a tie-high, tie-low circuit having a regenerative device in accordance with one embodiment of the present invention.

FIG. 1 illustrates a tie-high, tie-low circuit 100 having a regenerative device in accordance with one embodiment of the present invention. The source of a PMOS transistor 102 is electrically coupled to VDD, and the drain of the PMOS transistor 102 is electrically coupled to a tie-high output 106 having an always-high signal, and further electrically coupled to the gate of a NMOS transistor 104. These two transistors can be seen respectively as tie-high and tie-low transistors for the circuit 100. The source of the NMOS transistor 104 is electrically coupled to VSS, and the drain of the NMOS transistor 104 is electrically coupled to the gate of the PMOS transistor 102 and further connected to a tie-low output 108 having an always-low signal. In one exemplary embodiment, the always-high and always-low outputs may be the operating voltage and the ground voltage, respectively, of the circuit. Additional ESD safety is provided by not connecting any transistor gate to VDD or VSS. In operation, the circuit 100 tends to deliver the intended outputs. The PMOS transistor 102 provides the tie-high output when it is enabled and the NMOS transistor 104 provides the tie-low output when it is enabled. However, since any instability might briefly introduce the wrong bias to one of the gates, either or both transistors may be turned off, thereby rendering the biases at the outputs to be undeterminable. A semiconductor device, such as a transistor or a diode, can be used as a regenerative circuit to establish a correct bias after any such disturbing event. It is notable that, rather than connecting such a regenerative circuit to VDD or VSS, as has been done previously, the regenerative circuit will be connected to the gates of the tie-high and tie-low transistors, the effect of which is to provide additional ESD safety. With reference to FIG. 1, a regenerative circuit 110 is connected between the tie-high output 106 and the tie-low output 108. Since the regenerative circuit 110 is polarized by nature, it is essentially inert in normal operation. In response to a disturbing event, the regenerative circuit 110 would conduct an unintended positive charge from the tie-low output 108 to the tie-high output 106, or it would conduct an unintended negative charge from the tie-high output 106 to the tie-low output 108. This set of actions automatically re-establishes correct biases and correct outputs.

Figure 3:
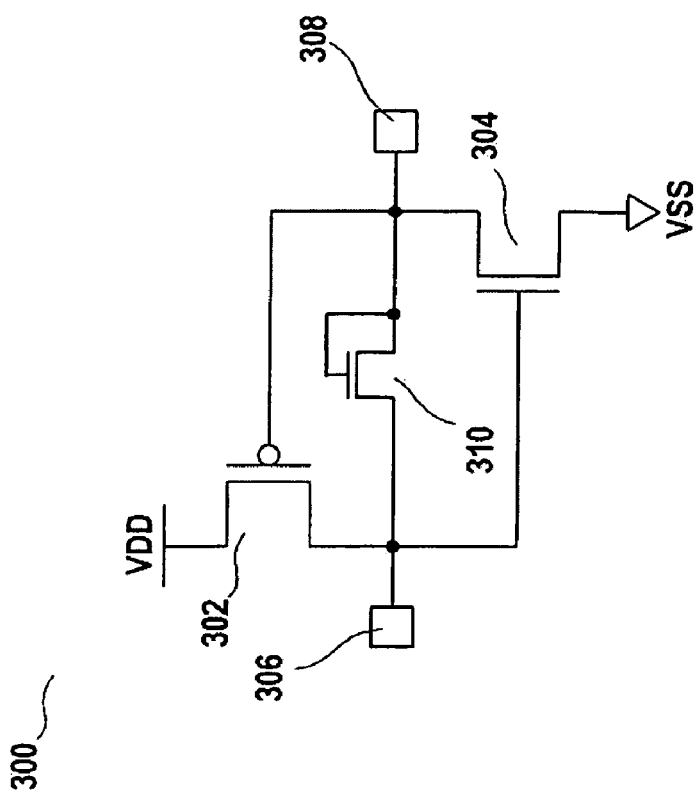
FIGS. 2, 3, and 4 illustrate three tie-high, tie-low circuits having three unique regenerative devices in accordance with various examples of the present invention.
Figure 2:
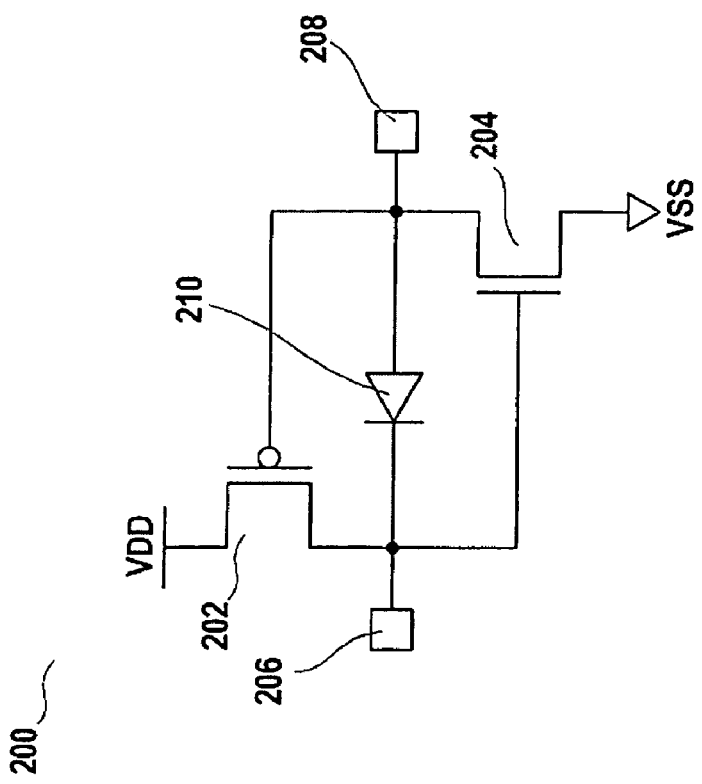
Figure 4:
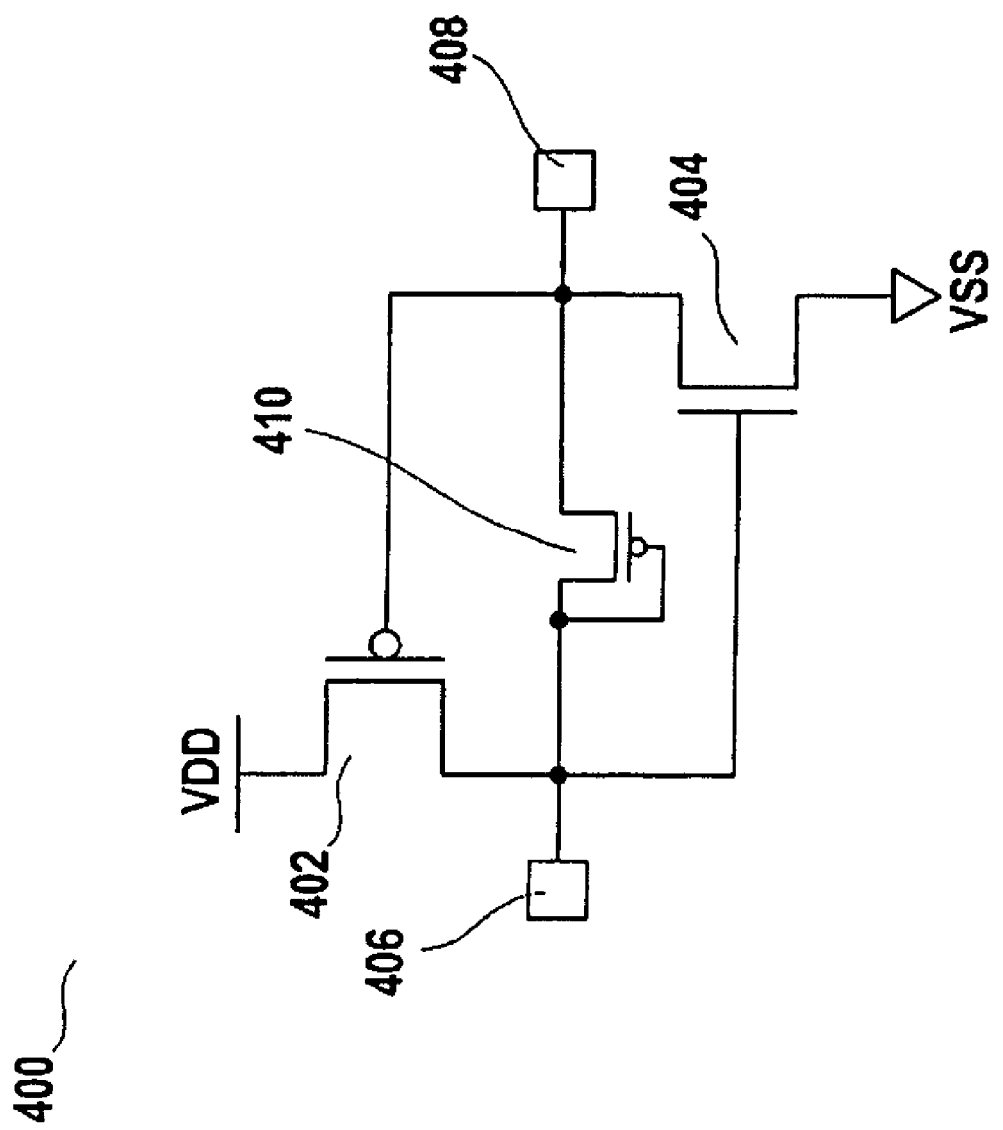

Specific examples of such a regenerative circuit are illustrated in FIGS. 2, 3, and 4. FIG. 2 illustrates a circuit 200 with an always-high output and an always-low output. The source of a PMOS transistor 202 is connected to VDD, and the drain of the PMOS transistor 202 is connected to the gate of a NMOS transistor 204 and further connected to a tie-high output 206 having an always-high signal. The source of the NMOS transistor 204 is electrically coupled to VSS, and the drain of the NMOS transistor 204 is connected to the gate of PMOS transistor 202 and further connected to a tie-low output 208 having an always-low signal. Additional ESD safety is provided since no transistor gate is connected to VDD or VSS. In operation, the circuit 200 tends to deliver the intended outputs. However, any instability might briefly introduce the wrong bias to one of the gates, thereby turning off both transistors and rendering the biases at the outputs to be undeterminable. Rather than connecting a regenerative circuit between an output and either VDD or VSS, as has been done previously, the present invention connects a regenerative circuit 210 between the tie-high output 206 and the tie-low output 208. As shown in FIG. 2, the regenerative circuit 210 is a simple diode, whose cathode is connected to the tie-high output 206 and whose anode is connected to the tie-low output 208. Since the regenerative circuit 210 is polarized by nature, it is inert in normal operation. In response to a disturbing event, such as a positive charge on the gate of the PMOS transistor 202, which is also the tie-low output 208, the regenerative circuit 210 would conduct the unintended positive charge from the tie-low output 208 to the tie-high output 206. This action automatically re-establishes the correct biases: a positive bias on the tie-high output 206 and a negative bias on the tie-low output 208.

In an ESD event, a positive charge attempts to travel from VDD to VSS. In conventionally used circuits with always-high and always-low outputs, the ESD current path includes one gate oxide breakdown voltage ($V_{bk}$) and one threshold voltage ($V_t$). In this example, the ESD current path includes the gate oxide breakdown voltage of both transistors ($2 \times V_{bk}$) and the forward voltage of the diode ($V_f$). Therefore, there is a slightly bigger ESD turn-on voltage, and hence ESD tolerance, with the present invention.

FIG. 3 illustrates a circuit 300 with an always-high output and an always-low output. The source of a PMOS transistor 302 is connected to VDD, and the drain of the PMOS transistor 302 is connected to the gate of a NMOS transistor 304 and further connected to a tie-high output 306 having an always-high signal. The source of the NMOS transistor 304 is connected to VSS, and the drain of the NMOS transistor 304 is connected to the gate of the PMOS transistor 302 and further connected to a tie-low output 308 having an always-low signal. Additional ESD safety is provided since no transistor gate is connected to VDD or VSS, as explained previously. In operation, the circuit 300 tends to deliver the intended outputs. However, any instability might briefly introduce the wrong bias to one of the transistor gates, thereby turning off both transistors and rendering the biases at the outputs to be undeterminable. Rather than connecting a regenerative circuit between an output and either VDD or VSS, as has been done previously, the present invention connects a regenerative circuit 310 between the tie-high output 306 and the tie-low output 308. With reference to FIG. 3, the regenerative circuit 310 is an NMOS transistor, whose source is connected to the tie-high output 306 and whose drain and gate are both connected to the tie-low output 308. The regenerative circuit 310 is polarized by nature, so it is inert in normal operation. In response to a disturbing event, such as a positive charge on the gate of the PMOS transistor 302, which is also the tie-low output 308, the regenerative circuit 310 would conduct the unintended positive charge from the tie-low output 308 to the gate of the NMOS transistor 304, which is connected to the tie-high output 306. This set of actions automatically re-establishes the correct biases: a positive bias on the tie-high output 306 and a negative bias on the tie-low output 308.

FIG. 4 illustrates a circuit 400 with an always-high output and an always-low output. The source of a PMOS transistor 402 is connected to VDD, and the drain of the PMOS transistor 402 is connected to the gate of a NMOS transistor 404 and further connected to a tie-high output 406 having an always-high signal. The source of the NMOS transistor 404 is connected to VSS, and the drain of the NMOS transistor 404 is connected to the gate of the PMOS transistor 402 and further connected to a tie-low output 408 having an always-low signal. Additional ESD safety is provided since no transistor gate is connected to VDD or VSS, as explained previously. In operation, the circuit 400 tends to deliver the intended outputs. However, any instability might briefly introduce the wrong bias to one of the gates, thereby turning off both transistors and rendering the biases at the outputs to be undeterminable. Rather than connecting a regenerative circuit between an output and either VDD or VSS, as has been done previously, the present invention connects a regenerative circuit 410 between the tie-high output 406 and the tie-low output 408. With reference to FIG. 4, the regenerative circuit 410 is a PMOS transistor, whose source is connected to the tie-low output 408 and whose drain and gate are connected to the tie-high output 406. Since the regenerative circuit 410 is polarized by nature, it is inert in normal operation. In response to a disturbing event, such as a negative charge on the gate of the NMOS transistor 404, which is also the tie-low output 408, the regenerative circuit 410 would conduct the unintended negative charge from the tie-high output 406 to the tie-low output 408. This action automatically re-establishes the correct biases: a positive bias on the tie-high output 406 and a negative bias on the tie-low output 408.

The present invention achieves circuit simplicity and increased electrostatic discharge (ESD) tolerance by adding a regenerative circuit that is connected between the always-high output and the always-low output. The basic circuit includes two transistors and the regenerative circuit includes either one diode or one transistor. In each of the three examples, the regenerative circuit is inert in normal operation. The regenerative circuit establishes the designed biases at start-up and re-establishes them in the event of any disturbing event.

Figure 5:
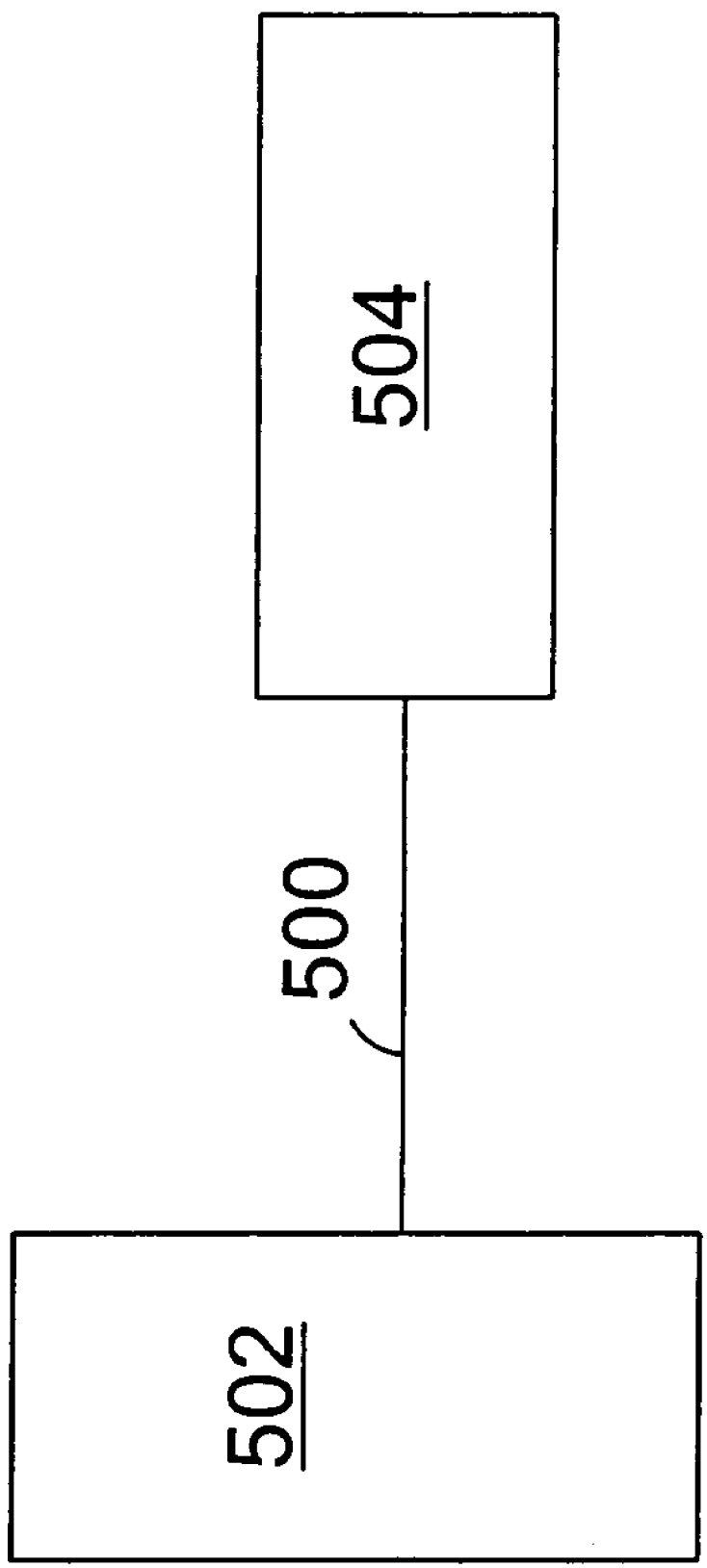
FIG. 5 illustrates an unused input of an integrated circuit coupled to a tie-high, tie-low circuit having a regenerative device.

FIG. 5 illustrates an unused input 500 of an integrated circuit 502 coupled to a tie-high, tie-low circuit 504 having a regenerative device.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A tie-high, tie-low circuit for locking signal logic states, the circuit comprising:
   a regenerative device electrically coupled directly to both a tie-high output and a tie-low output;
   at least a first electronic device electrically coupled to a high-voltage and the tie-high output and a second electronic device electrically coupled to a low voltage and the tie-low output.

2. The tie-high, tie-low circuit of claim 1 wherein the first electronic device provides the tie-high output when the first electronic device is enabled and the second electronic device provides the tie-low output when the second electronic device is enabled.

3. The tie-high, tie-low circuit of claim 1 wherein the tie-high output has an always-high first signal having a high voltage, and the tie-low output has an always-low second signal having a low voltage.

4. The tie-high, tie-low circuit of claim 1 wherein the tie-high output is an operating voltage of the tie-high, tie-low circuit and the tie-low output is a ground voltage of the tie-high, tie-low circuit.

5. The tie-high, tie-low circuit of claim 1 wherein the first device is a PMOS device and the second device is a NMOS device.

6. The tie-high, tie-low circuit of claim 5 wherein the PMOS device is a PMOS transistor having its source electrically coupled to the high voltage and the NMOS device is an NMOS transistor having its source electrically coupled to the low voltage.

7. The tie-high, tie-low circuit of claim 5 wherein the tie-low output controls the PMOS device and the tie-high output controls the NMOS device.

8. The tie-high, tie-low circuit of claim 1 wherein the regenerative device comprises at least one diode including a cathode and anode coupled, respectively, to the tie-high output and the tie-low output.

9. The tie-high, tie-low circuit of claim 1 wherein the regenerative device comprises an NMOS transistor with its source coupled to the tie-high output and its drain and gate both coupled to the tie-low output.

10. The tie-high, tie-low circuit of claim 1 wherein the regenerative device comprises a PMOS transistor with its source electrically coupled to the tie-low output and its drain and gate electrically coupled to the tie-high output.

11. A tie-high, tie-low system for locking a signal logic state of at least one signal in an integrated circuit, the system comprising:
 a tie-high output having a relatively high voltage first signal and a tie-low output having a relatively low voltage second signal;
 a regenerative device electrically coupled between the tie-high and the tie-low outputs;
 at least a PMOS transistor having its source electrically coupled to a high supply voltage of the integrated circuit and its drain electrically coupled to the tie-high output, and an NMOS transistor having its source electrically coupled to a low supply voltage of the integrated circuit and its drain electrically coupled to the tie-low output, wherein the regenerative device comprises one of:
 at least one diode including a cathode and anode coupled, respectively, to the tie-high output and the tie-low output;
 at least one NMOS transistor with its source coupled to the tie-high output and its drain and gate both coupled to the tie-low output; and
 at least one PMOS transistor with its source electrically coupled to the tie-low output and its drain and gate electrically coupled to the tie-high output.

12. The tie-high, tie-low system of claim 11 wherein the tie-low output controls a gate of the PMOS device and the tie-high output controls a gate of the NMOS device.

13. A semiconductor device comprising:
 an integrated circuit with one or more inputs; and
 a tie-high, tie-low circuit comprising a tie-high output having a relatively high voltage first signal and a tie-low output having a relatively low voltage second signal,
 a regenerative device electrically coupled directly to the tie-high and the tie-low outputs, and
 at least a first electronic device electrically coupled to a high-voltage source and the tie-high output and a second electronic device electrically coupled to the low voltage source and the tie-low output,
 wherein at least one unused input is coupled to either the tie-high or tie-low output of the tie-high, tie-low circuit for locking its logic state by the regenerative device.

14. The semiconductor device of claim 13 wherein the first electronic device is a PMOS transistor and the second electronic device is a NMOS transistor.

15. The semiconductor device of claim 14 wherein the PMOS transistor having a source electrically coupled to VDD of the integrated circuit and a drain electrically coupled to the tie-high output, and the NMOS transistor having a source electrically coupled to Vss of the integrated circuit, a drain electrically coupled to the tie-low output, and a gate electrically coupled to the drain of the PMOS transistor.

16. The semiconductor device of claim 13 wherein the regenerative device comprises at least one diode including a cathode and anode coupled, respectively, to the tie-high output and the tie-low output.

17. The semiconductor device of claim 13 wherein the regenerative device comprises at least one NMOS transistor with its source coupled to the tie-high output and its drain and gate both coupled to the tie-low output.

18. The semiconductor device of claim 13 wherein the regenerative device comprises at least one PMOS transistor with its source electrically coupled to the tie-low output and its drain and gate electrically coupled to the tie-high output.

19. A tie-high, tie-low circuit for locking signal logic states, the circuit comprising:
 a regenerative device electrically coupled to both a tie-high output and a tie-low output;
 at least a first electronic device electrically coupled to a high-voltage and the tie-high output and a second electronic device electrically coupled to a low voltage and the tie-low output,
 wherein the regenerative device comprises at least one diode including a cathode and anode coupled, respectively, to the tie-high output and the tie-low output.

* * * * *

UNITED STATES PATENT AND TRADEMARK OFFICE
CERTIFICATE OF CORRECTION

PATENT NO. : 7,221,183 B2  Page 1 of 1
APPLICATION NO. : 11/064362
DATED : May 22, 2007
INVENTOR(S) : Ker-Min Chen It is certified that error appears in the above-identified patent and that said Letters Patent is hereby corrected as shown below:

Column 5, line 12, delete "voltage" and insert therefore -- voltage --

Signed and Sealed this

Twenty-third Day of October, 2007

JON W. DUDAS
*Director of the United States Patent and Trademark Office*